United States Patent [19]

Shappirio et al.

[11] Patent Number: 4,940,693

[45] Date of Patent: Jul. 10, 1990

[54] HIGH TEMPERATURE SUPERCONDUCTING THIN FILM STRUCTURE AND METHOD OF MAKING

[75] Inventors: Joel R. Shappirio; Thomas R. Aucoin, both of Monmouth; John J. Finnegan, Atlantic Highlands, all of N.J.

[73] Assignee: The United States of America as represented by the Secretary of the Army, Washington, D.C.

[21] Appl. No.: 225,439

[22] Filed: Jul. 28, 1988

[51] Int. Cl.$^5$ ............................................. B32B 9/00
[52] U.S. Cl. ..................................... 505/1; 505/702; 505/703; 505/704; 428/688; 428/700; 428/704; 428/930; 427/62; 427/69; 427/372.2; 427/375; 156/89; 156/614

[58] Field of Search .................. 505/1, 702, 703, 704; 428/688, 930, 700, 704; 427/62, 69, 372.2, 375; 156/89, 624

[56] References Cited

PUBLICATIONS

Glass Bonded Composites etc. Nies et al, Mat. Res. Bull., pp. 623–630, 1988.

*Primary Examiner*—Patrick Ryan
*Attorney, Agent, or Firm*—Michael Zelenka; Roy E. Gordon

[57] ABSTRACT

The use of a highly stable, lattice-matched barrier layer grown epitaxially on a suitable substrate, and permitting the subsequent epitaxial growth of a thin high-temperature superconducting film with optimized properties.

5 Claims, No Drawings

HIGH TEMPERATURE SUPERCONDUCTING THIN FILM STRUCTURE AND METHOD OF MAKING

The invention described herein may be manufactured, used, and licensed by or for the Government for governmental purposes without the payment to us of any royalty thereon.

This invention relates to a high temperature superconducting thin film structure and to a method of making such a structure.

BACKGROUND OF THE INVENTION

High temperature superconducting thin film structures produced by current fabrication methods have deposited the high temperature superconducting thin film directly onto a suitable single crystal substrate such as strontium titanate, yttria-stabilized zirconia, alumina or magnesium oxide (periclase), or have used a barrier layer such as Ag, Pt, Nb, $ZrO_2$, etc., to separate the superconductor from the substrate. None of the currently employed buffer layers have been lattice matched to the substrate. Thus, in the absence of the buffer layer, the film may react with the substrate, allowing diffusion of the constituent species from the substrate into the superconducting film or from the film into the substrate, either of which resulting in the modification of the properties of the superconductor. With a buffer layer which has not been lattice matched to the substrate, optimization of the crystalline perfection of the superconducting film is impeded.

SUMMARY OF THE INVENTION

The general object of this invention is to provide an improved high temperature superconducting thin film structure. A more specific object of the invention is to provide a high temperature superconducting thin film structure in which there will be no degradation suffered as the result of chemical reactions between the film and its substrate. A further object of the invention is to provide a high temperature superconducting thin film structure having optimized crystalline perfection and thus optimized superconducting properties.

It has now been found that the aforementioned objects can be attained by providing a diffusion barrier layer between the substrate layer and the superconducting film that achieves a lattice match, both to the substrate and to the superconducting film, that enables significantly improved crystal perfection to be achieved as compared to existing methods of fabrication.

More particularly, the diffusion barrier layers of this invention are chosen from a group of compounds that are known to possess a unique set of physical properties that optimize their effectiveness in the present application, being extremely refractory, chemically stable, and having metallic properties, including high electrical conductivity. The highly refractory nature of the barrier layer leads to an important improvement provided by the invention. That is, since the high Tc thin film superconducting films are required to carry extremely high currents having current densities of 3 times $10^6$ amps/cm$^2$, local heating of the structure is substantial, and the high melting points of the barrier layers provide improved high temperature stability. The barrier layers of the invention function effectively regardless of the deposition method used for the superconducting thin film that overlies it. Thus, any suitable method may be usefully employed for the superconductor, including CVD, evaporation, dc and or rf sputtering, laser ablation, molecular beam epitaxy, etc.

According to this invention, the substrate is a suitable single crystal such as strontium titanate, $SrTiO_3$, or yttria-stabilized zirconia $ZrO_2$—(Y), or alumina, $Al_2O_3$ or magnesium oxide, MgO. The substrate material is suitably oriented so that its lattice parameters will coincide with the superconducting layer to be deposited onto it. The critical lattice parameters for this orientation are determined by the lattice parameters of the superconducting material $YBa_2Cu_3O_7$, namely as close as possible to the values of a=3.8198 and c=3.8849 for the superconducting thin film layer.

The critical feature of this invention is the diffusion barrier layer. This layer is selected from a group of components characterized by high chemical stability, high melting point, high electrical conductivity, and lattice match to the substrate layer and to the superconducting thin film layer. Compounds having these characteristics are the metal nitrides, borides, carbides, and fluorides. Virtually any of these compounds will work reasonably well in the present invention, possessing the first three of the characteristics listed. The most suitable owing to a better match in lattice parameters include $YB_2$, $TbB_2$, $PuB_2$, VN, VC, $U_2C_3$, CrN, $W_2N$, (both the beta and gamma phases), the diborides of Gd, Dy, and Ho, the tetragonal tetraborides of Y, Pu, Ce, Sm, and Er, the hexaborides of Ca, Sr, Ba, Sc, Y, Th, Pu, La, Ce, Pr, Nd, Sm, Eu, Gd, Tb, Dy, Ho, Er, Tm, Yb, and Lu, and the tetrafluoride of Zr, $ZrF_4$.

DESCRIPTION OF THE PREFERRED EMBODIMENT

Suitably polished substrates are loaded into a vacuum deposition chamber and pumped down prior to diffusion barrier layer deposition. The deposition of the barrier layer may be accomplished by any appropriate vacuum deposition method, including e-beam evaporation or dc, rf or magnetron sputtering from composite targets of the compound, by reactive sputtering from a pure metal target in an appropriate ambient gas containing the non-metal species, such as $CO_2$, $N_2$, diborane, by CVD or MBE methods, etc. The deposition is conducted at a temperature suitable for epitaxial growth of the chosen compound, typically at 500°-700° C. This deposition is then followed by the deposition of the superconducting thin film, either in the same or a different vacuum deposition chamber by any of the aforementioned vacuum means. Annealing of the superconducting film in an oxygen ambient is critical in order to achieve an optimum oxygen concentration in the final superconducting thin film and to allow the superconducting film to grow epitaxially on the lattice matched barrier layer. Although the annealing step is not a part of this invention, the presence of the barrier layer contributes to the process by preventing a reaction between the superconducting film and the substrate. After optimization of the superconducting film, a hermatic cap is then evaporated to prevent further modification of the superconducting film. Cap layers may be achieved with a variety of compounds, including the instant barrier layers, SiC, $Si_3N_4$, silicon oxynitride, etc.

In the aforedescribed embodiment, the thickness of the superconducting layer is about 0.5 to 5 mm; the thickness of the diffusion barrier layer is about 50 to 100 nm, and the thickness of the substrate is about 150 to 1600 mm.

Other high temperature superconducting thin film materials can be used in the invention in lieu of $YBa_2Cu_3O_7$ include $Tl_2Ba_2CaCu_2O_8$, $Bi_2CaSr_2Cu_2O_{7-x}$, $BiCaSrCu_2O_{7-x}$, $Bi_2Ca_2SrCu_3O_{7-x}$ and $BiCa_2Sr_3Cu_4O_{7-x}$ where x can range from zero to 1.

The potential applications of this invention are extensive for both military and commercial use. They include microwave application for high-Q cavities, waveguides, striplines and satellite antennae, magnetic shielding for e-beam focussing and magnetic biasing structures, SQUIDS for weak-link magnetic sensors, low loss interconnects and leads for semiconductors, etc.

We wish it to be understood that we do not desire to be limited to the exact details of construction as described for obvious modifications will occur to a person skilled in the art.

What is claimed is:

1. A high temperature superconducting thin film structure, said structure comprising a substrate and a high $T_c$ superconducting thin film spaced from said substrate, a diffusion barrier layer in the space between said substrate and said high $T_c$ superconducting thin film wherein the diffusion barrier layer is lattice matched both to the substrate and to the superconducting film and wherein the diffusion barrier layer has a high chemical stability, a high melting point, and a high electrical conductivity, and wherein the diffusion barrier layer is a compound selected from the group consisting of $YB_2$, $TbB_2$, VN, VC, $V_2C_3$, CrN, $W_2N$, GdB, DyB, HoB, the tetragonal tetraborides of Y, Pu, Ce, Sm, and Er, the hexaborides of Ca, Sr, Y, Th, Pu, La, Ce, Pr, Nd, Sm, Eu, Gd, Tb, Dy, Ho, Er, Tm, Yb, and Lu, and the tetrafluoride of Zr, $ZrF_4$, and wherein the substrate is a single crystal selected from the group consisting of strontium titanate, $SrTiO_3$, yttria-stabilized zirconia, $ZrO_2$—(Y), alumina, $Al_2O_3$, and magnesium oxide, MgO, and wherein the superconducting thin film material is selected from the group consisting of $YBa_2Cu_3O_7$, $Tl_2Ba_2CaCu_2O_8$, $Bi_2CaSr_3Cu_2O_{7-x}$, $BiCaSrCu_2O_{7-x}$, $Bi_2Ca_2SrCu_3O_{7-x}$, and $BiCa_2Sr_3Cu_4O_{7-x}$ where x can range from zero to 1.

2. A high temperature superconducting thin film structure according to claim 1 having an hermetic cap layer to prevent further modification of the superconducting film.

3. A high temperature superconducting thin film structure according to claim 2 wherein the diffusion barrier layer is a compound selected from the group consisting of $YB_2$, $TbB_2$, VN, VC, $U_2C_3$, CrN, $W_2N$, $GdB_2$, $DyB_2$, $HoB_2$, the tetragonal tetraborides of Y, Pu, Ce, Sm, and Er, the hexaborides of Ca, Sr, Ba, Sc, Y, Th, Pu, La, Ce, Pr, Nd, Sm, Eu, Gd, Tb, Dy, Ho, Er, Tm, Yb, and Lu, and the tetrafluoride of Zr, $ZrF_4$, wherein the substrate is a single crystal selected from the group consisting of strontium titanate, $SrTiO_3$, yttria-stabilized zirconia, $ZrO_2$—(Y), alumina $Al_2O_3$, and magnesium oxide, MgO and wherein the superconducting thin film material is selected from a group consisting of $YBa_2Cu_3O_7$, $Tl_2Ba_2CaCu_2O_8$, $Bi_2CaSr_2Cu_2O_{7-x}$, $BiCaSrCu_2O_{7-x}$, $Bi_2Ca_2SrCu_3O_{7-x}$, and $BiCa_2Sr_3Cu_4O_{7-x}$, where x can range from zero to 1.

4. Method of making a superconducting thin film structure from a suitably polished substrate, wherein the substrate is a single crystal selected from the group consisting of strontium titanate, $SrTiO_3$, yttria stabilized zirconia $ZrO_2$—(Y), alumina, $Al_2O_3$ and magnesium oxide, MgO, said method including the steps of:

(A) loading the substrate into a vacuum deposition chamber and pumping the chamber down, (B) vacuum depositing a diffusion barrier layer onto the substrate at a temperature suitable for epitaxial growth, wherein the diffusion barrier layer is a compound selected from the group consisting of $YB_2$, $TbB_2$, VN, VC, $U_2C_3$, CrN, $W_2N$, $GdB_2$, $DyB_2$, $HoB_2$, the tetragonal tetraborides of Y, Pu, Ce, Sm and Er, the hexaborides of Ca, Sr, Ba, Sc, Y, Th, Pu, La, Ce, Pr, Nd, Sm, Eu, Gd, Tb, Dy, Ho, Er, Yb, and Lu, and the tetrafluoride of Zr, $ZrF_4$, (C) vacuum depositing a superconducting thin film onto the diffusion barrier layer, wherein the superconducting thin film material is selected from the group consisting of $YBa_2Cu_3O_7$, $Tl_2Ba_2CaCu_2O_8$, $Bi_2CaSr_2Cu_2O_{7-x}$, $Bi_2CaSr_2Cu_3O_{7-x}$, and $BiCa_2Sr_3Cu_4O_{7-x}$, where x can range from zero to 1, (D) annealing the superconducting thin layer in an oxygen ambient, and (E) evaporating a hermetic cap onto the superconducting thin film to prevent further modification of the superconducting film.

5. Method according to claim 4 wherein in step (B) the temperature is about 500° to about 700° C.

* * * * *